United States Patent
Cotton et al.

(10) Patent No.: US 7,224,828 B2
(45) Date of Patent: *May 29, 2007

(54) TIME RESOLVED NON-INVASIVE DIAGNOSTICS SYSTEM

(75) Inventors: Daniel Murdoch Cotton, Mountain View, CA (US); Nader Pakdaman, Los Gatos, CA (US); James Squire Vickers, Jamaica Plain, MA (US); Thomas Wong, Menlo Park, CA (US)

(73) Assignee: Credence Systems Corporation, Milpitas, CA (US)

( * ) Notice: Subject to any disclaimer, the term of this patent is extended or adjusted under 35 U.S.C. 154(b) by 703 days.

This patent is subject to a terminal disclaimer.

(21) Appl. No.: 10/457,968

(22) Filed: Jun. 9, 2003

(65) Prior Publication Data

US 2003/0210057 A1 Nov. 13, 2003

Related U.S. Application Data

(62) Division of application No. 09/995,548, filed on Nov. 28, 2001, now Pat. No. 6,621,275.

(51) Int. Cl.
*G06K 9/00* (2006.01)

(52) U.S. Cl. ............... 382/144; 324/537; 324/754; 324/758

(58) Field of Classification Search ........... 382/144, 382/151; 324/537, 765, 501, 724, 719, 754, 324/758

See application file for complete search history.

(56) References Cited

U.S. PATENT DOCUMENTS

| | | |
|---|---|---|
| 4,637,733 A | 1/1987 | Charles et al. |
| 5,057,771 A | 10/1991 | Pepper |
| 5,270,643 A | 12/1993 | Richardson et al. |
| 5,900,755 A | 5/1999 | Toeppen et al. |
| 5,940,545 A | 8/1999 | Kash et al. |
| 6,028,952 A | 2/2000 | Kash et al. |

(Continued)

FOREIGN PATENT DOCUMENTS

DE 4244268 7/1994

(Continued)

OTHER PUBLICATIONS

D. Porat, *Review of Sub-Nanosecond Timer-Interval Measurements*, IEEE Transactions on Nuclear Science, vol. NS-20, No. 5, 1973, pp. 36-51.

(Continued)

*Primary Examiner*—Sheela Chawan
(74) *Attorney, Agent, or Firm*—Sughrue Mion, PLLC; Joseph Bach (57) ABSTRACT

A system for probe-less non-invasive detection of electrical signals from integrated circuit devices is disclosed. The system includes an illumination source, collection optics, imaging optics, and a photon sensor. In a navigation mode, the light source is activated and the imaging optics is used to identify the target area on the chip and appropriately position the collection optics. Once the collection optics is appropriately positioned, the light source is deactivated and the photon sensor is used to detect photons emitted from the chip. No mention of cooling (active device measurement capability) and advanced optics to detect the features (SIL).

20 Claims, 9 Drawing Sheets

U.S. PATENT DOCUMENTS

| | | |
|---|---|---|
| 6,172,512 B1 | 1/2001 | Evans et al. |
| 6,229,600 B1 | 5/2001 | Martynov .................... 356/123 |
| 6,270,696 B1 | 8/2001 | Jain et al. .................... 264/1.1 |
| 6,608,494 B1 | 8/2003 | Bruce et al. |
| 6,621,275 B2 * | 9/2003 | Cotton et al. ............... 324/537 |
| 6,657,446 B1 | 12/2003 | Goruganthu et al. |
| 6,788,093 B2 | 9/2004 | Aitren et al. |
| 6,819,117 B2 | 11/2004 | Wilsher |

FOREIGN PATENT DOCUMENTS

| | | |
|---|---|---|
| EP | 0 937 989 A2 | 8/1999 |
| EP | 0977192 | 2/2000 |
| JP | 11273132 | 8/1999 |
| WO | WO97/41556 | 11/1997 |

OTHER PUBLICATIONS

M. Fahmie, *A System for Providing High Quality Triggers to Experimental Areas*, Proceedings of the Particle Accelerator Conference1999, Mar. 27, 1999, pp. 756-758.

J. Bude, *Hot-carrier luminescence in Si*, PHYS. REV. B, 45(11), Mar. 15, 1992, pp. 5848-5856.

S. Villa et al., *Photon emission from hot electrons in silicon*, PHYS. REV. B, 52(15), Oct. 15 1995-I, pp. 10993-10999.

J. Kash et al., *Full Chip Optical Imaging of Logic State Evolution in CMOS Circuits*, IEDM 96 Late News Paper (1996) 1, pp. 934-936.

D. Knebel et al., *Diagnosis and Characterization of Timing-Related Defects by Time-Dependent Light Emission*, ITC PROCEEDINGS 1998.

M. Bruce et al., *Waveform Acquisition from the Backside of Silicon Using Electro-Optic Probing*, Proceedings From the 25th International Symposium for Testing and Failure Analysis, Nov. 14-18, 1999, pp. 19-25.

T. Eiles et al., *Optical Probing of VLSI IC's from the Silicon Backside*, Proceedings From the 25th International Symposium for Testing and Failure Analysis, Nov. 14-18, 1999, pp. 27-33.

M. McManus, *Picosecond Imaging Circuit Analysis of the IBM G6 Microprocessor Cache*, Proceedings From the 25th International Symposium for Testing and Failure Analysis, Nov. 14-18, 1999, pp. 35-38.

N. Goldblatt et al., *Unique and Practical IC Timing Analysis Tool Utilizing Intrinsic Photon Emission*, Microelectronics Reliability 41 (2001) 1507-1512.

G. Dajee et al., *Practical, Non-Invasive Optical Probing for Flip-Chip Devices*, ITC Paper 15.3 (Baltimore, Oct. 28-Nov. 2, 2001) 433-442.

*IDS® PICA, Advanced Optical Imaging for Analysis of 0.13-micron and SOI Devices*, Schlumberger Semiconductor Solutions brochure printed Mar. 2001, four pages.

Khurana, N. and Chiang, C-L, "Analysis of Product Hot Electron Problems By Gated Emission Microscopy," Intel Corp., Jun. 1986, pp. 189-194, IEEE/IRPS, U.S.A.

US 6,304,668, 10/2001, Evans et al. (withdrawn)

* cited by examiner

TIME RESOLVED NON-INVASIVE DIAGNOSTICS SYSTEM

This application is a divisional of, and claims priority from, U.S. patent application Ser. No. 09/995,548, filed Nov. 28, 2001 now U.S. Pat No. 6,621,275.

BACKGROUND OF THE INVENTION

1. Field of the Invention

The present invention relates to a system for in-situ transistor level measurement of circuit timing information directly related to the switching events (logic transitions) of switching events of transistors of electrically active semiconductor integrated circuits.

2. Description of the Related Art

It is known in the prior art that various mechanisms in semiconductor devices can cause light emission. Detection of such light emission has been used to investigate semiconductor devices. For example, avalanche breakdown in insulators cause light emission, and detection of such light emission can point to the locations of failure in the device. Similar detection can be used to characterize electrostatic discharge in the device. In electrically stimulated (active) transistors accelerated carriers (electrons & holes), a.k.a. hot-carriers, emit light when the device draws current. Various emission microscopes have been used for detecting locations on the device where the electrical current drawn exceeds the expected levels and therefore could lead to locating failures in semiconductor devices. Some of these hot-carrier emission microscopes have been disclosed in the prior art. Examples of such emission microscopes are described in, for example, U.S. Pat. Nos. 4,680,635, 4,811,090, and 5,475,316.

For transistors (i.e. complementary meal oxide semiconductor (CMOS)) devices the current "pulse" coincides (in-time and characteristics) directly with the voltage transition responsible for the change in the state (logic) of the device. Of specific interest to this invention is resolving in time the hot-electron emissions from electrically active semiconductor transistor devices, to study the behavior and response of the device to electrical currents and the temporal relations of the current pulses with respect to each other. These temporal characteristics, along with the detection of the transition (pulse) itself is of critical importance in design and debug of integrated circuit (IC) devices. Previous and related works on the subject have been published and represented by the following papers:

All-Solid-State Microscope-Based System for Picosecond Time-Resolved Photoluminescence Measurements on II–VI semiconductors, G. S. Buller et al., Rev. Sci. Instrum. pp.2994, 63, (5), (1992);

Time-Resolved Photoluminescence Measurements in InGaAs/InP Multiple-Quantum-Well Structures at 1.3-m Wavelengths by Use of Germanium Single-Photon Avalanche Photodiodes, G. S. Buller et al., Applied Optics, Vol 35 No. 6, (1996);

Analysis of Product Hot Electron Problems by Gated Emission Microscope, Khurana et al., IEEE/IRPS (1986);

Ultrafast Microchannel Plate Photomultiplier, H. Kume et al., Appl. Optics, Vol 27, No. 6, 15 (1988); and Two-Dimensional Time-Resolved Imaging with 100-ps Resolution Using a Resistive Anode Photomultiplier Tube, S. Charboneau, et al., Rev. Sci. Instrum. 63 (11), (1992).

Notably, Khurana et al., demonstrated that photoluminescence hot-carrier emission coincides in time and characteristics with the current pulse and thereby the voltage switching of a transistor, thereby teaching that, in addition to failure analysis (location of "hot-spots" where the device may be drawing current in excess of its design), the phenomenon can also be used for obtaining circuit timing information (switching) and therefore used for IC device debug and circuit design. See, also, U.S. Pat. No. 5,940,545 to Kash et al., disclosing a system for such an investigation.

As can be appreciated from the above-cited works, the light emission in semiconductor devices is very faint. Accordingly, various optical and detection schemes have been proposed to more efficiently collect the emission and reduce the noise, i.e., increase collection fidelity, bandwidth, and speed of the collection and detection system. For example, commercially available low-noise microchannel photomultipliers (MCPs) have been used to amplify the collected light by many orders of magnitude. Also, avalanche photodiodes (APDs) coupled with very fast optoelectric circuits (i.e. time-to-amplitude converter (TAC)) have been used to provide high temporal resolution of the faint emission phenomena.

From the collection optics perspective, in separate applications various attempts have been made to increase the focusing/imaging and collection of light from microscopic samples of the overall optical system. In particular, efforts have been made to increase the numerical aperture ($NA=n*\sin \theta$; n being the index of refraction of the medium and $\theta$ being the half-cone angle of the focusing beam) of the microscope objective lens. It has been long known that increasing the numerical aperture (NA) can be achieved by increasing not only the cone-angle but also increase the index of refraction, n, to match to that of the sample, and avoid the air (n=1) and sample interface index mismatch. One historical method for increasing "n" is to fill the air gap between a properly aberration corrected objective lens and the sample with an index matching oil that matches the index of refraction of the object. Where proper matching fluids are not available to achieve the index matching, other methods can be used, such as the use of a solid immersion lens (matching the material of the sample) placed between the object and the objective lens. Of course, one may use both techniques, i.e., use immersion lens and index matching fluid. The use of the above techniques is disclosed in, for example, U.S. Pat. Nos. 3,524,694, 3,711,186, and 3,912,378. More modern discussions of immersion lenses can be found in U.S. Pat. Nos. 4,634,234, 5,004,307, 5,208,648, 5,282,088 and Solid Immersion Microscopy, S. M. Mansfield, G.L. Report No. 4949, Stanford University 1992. In the case of solid immersion lenses, prior art lenses are plano-convex (i.e., hemispheres). That is, the bottom surface, i.e., the surface facing the object, is flat, while the top surface, i.e., the surface facing the objective lens is convex.

Semiconductor devices of particular interest to the present invention are ones that are packaged in flipchip format. In flipchip packaged devices the direct attachment between the IC device and package carrier alleviates the use of wire bonding of the IC "chip" to the carrier. Additionally, the transistors are readily accessible through the substrate and therefore are not "masked" by the multiple layers of metal interconnect. Since the build, implementation and structure of flip chip packaged devices are well known; it will not be discussed here in details. Information relating to flip chip can be found in, for example, http://www.flipchip.com and http://world.std.com/~hycomp/flippage.html.

Of specific interest is recent effort in the art to inspect such devices from the backside, i.e., from the substrate side, where the active layers of the IC transistors are readily accessible. One problem in probing flip chip packaged devices using conventional dynamic (timing) diagnostic methods, such as e-beam (voltage-contrast) probing, is that the critical nodes where timing information and fault isolation is critical are not readily accessible and masked by multiple levels of metal interconnects. Therefore, in order to expose the metal lines to the e-beam prober, one needs to either employ a forced ion beam (FIB) to "drill" through the substrate and expose the critical node metallurgy, or pre-design opening for test and probe structures. The former is a time consuming and destructive method, and the latter wastes precious "real-estate" and in many cases does not represent the features of interest to the circuit designer. Therefore, optical techniques have been employed to probe the device through the substrate (backside). It must be noted that any IC could be repackaged for a flip/direct attach. Also, most advanced sub 0.18 micron and (below) devices that require intense rounds of timing measurements and debug are in flip chips package format, and thereby render themselves to back-side optical probing and detection. The reader is directed to these three articles, published in the Proceedings of 1998 International Test Conference (ITC '98), Oct. 18–22, 1998, Washington, D.C., IEEE Catalog No. RS001911:

Novel Optical Probing Technique for Flip Chip Packaged Microprocessors, Mario Paniccia, Travis Eiles, V. R. M. Rao and Wai Mun Yee.

Diagnosis and Characterization of Timing-Related Defects by Time-Dependent Light Emission, Dave Vallett, Leendert Huisman, and Phil Nigh.

Contactless Gigahertz Testing, W. Mertin, A. Leyk, U. Behnke, and V. Wittpahl.

Another article of interest is Picosecond Noninvasive Optical Detection of Internal Electrical Signals in Flip-Chip-Mounted Silicon Integrated Circuits, H. K. Heinrich, IBM J. Res. Develop. Vol 34, No. 2/3 1990.

Systems for imaging flip-chips from the backside through the silicon substrate are described in U.S. Pat. Nos. 5,208,648, 5,220,403 and 5,940,545.

However, in spite of the amount of work in the field, there is still no commercially viable system for device debug by time resolved measurements of hot electron emission. Amongst many issues facing the industry are:

Fast, reliable acquisition speed where the detected signal fidelity (i.e. bandwidth and resolution) is not compromised.

Ability to make measurements on low (or zero) capacitance devices (i.e. ones who employ silicon-on-insulator (SOI) in place of the regular silicon substrate)

High spatial resolution imaging and navigation to enable the location of node's of interests in sub 0.2 micron devices Cooling and power load management of the devices while under test (electrically stimulated), and operating without their heat-sink to allow for access to the device.

SUMMARY OF THE INVENTION

The present inventors provide a commercially viable integrated system for IC device debug by time resolved measurements of hot electron photo emission, providing high spatial resolution imaging and high temporal resolution detection. Moreover, the system enables cooling and temperature control of the device under test (DUT). Furthermore, the system enables navigation and imaging using the IC computer-aided design (CAD) layout. The inventive system is particularly useful for testing and debugging functional semiconductor integrated circuits having operational currents flowing therein.

In one aspect of the invention, an integrated system for testing an integrated circuit chip is provided. The chip under test is coupled to an Automated Test Equipment (ATE) that powers the device and stimulates it with programmed logic vectors and signals to simulate operating (functional & test) conditions of the chip. The inventive system comprises a controller receiving sync signals from the ATE; an optical imaging system for selectively imaging selected devices of the chip; a collection system for collecting photoemission from the chip and providing a time-resolved signal indicative of the photoemissions; an optomechanical navigation system for orienting the optical imaging system and the collection system with respect to the selected devices; and a thermal management system for cooling the chip to a temperature designated by the controller.

In another aspect of the invention, the inventive system comprises an x-y-z stage that is used to move the optics to the location of interest on the device under test, and focus and image the device(s) of interest. The navigation is performed in relation to a CAD layout of the IC. A mechanized shutter is used to variably define imaging areas within the field of view of the optics. During navigation and target acquisition, the device is illuminated and is imaged with an image intensifier, thereby providing high spatial resolution. When a device to be tested has been acquired, i.e., placed within the imaging area, the illumination source is turned off and the device is stimulated with test signals. During the stimulation period, hot electron photoemission is collected by the optics and is imaged onto a fiber optics.

To provide the temporal resolution, emission detection is synchronized with the test signals, i.e., the automated test equipment (ATE). Light collected by the fiber optics is detected by an avalanche photodiode (APD), which is coupled to an avalanche quenching circuit, a time-to-amplitude converter (TAC), and a multi-channel analyzer. Optionally, the APD is gated so that it assumes the detection condition only just before a light emission is expected according to the sync signal from the ATE. This provides reduction in noise and increases the life of the APD.

One advantageous feature of the inventive system is the active temperature control of the DUT. In debugging an IC, one issue of interest is the behavior of the various devices at various operating temperatures. Such study can point to performance and reliability issues caused by changes in the operating temperatures, and also provide device designers with highly temperature dependent crucial device junction operating conditions. The inventive system enables testing of the DUT at various controlled temperatures. Temperature control is provided separately to the chamber's interior and the DUT, and integrated with the optical imaging/detection system. According to one embodiment, cooling of the DUT is done using a cooling block with cooling fluid circulated therein. According to another embodiment, the DUT is cooled using liquid micro-spray cooling technique.

According to a particular feature of the invention, an immersion lens is used to increase the light collection efficiency and imaging resolution. In one inventive embodiment, the index matched immersion lens is bi-convex and is pressured onto the DUT during emission detection to ensure direct (no air-gap) contact with the DUT.

An autofocus may also be provided for enhanced stability of the system. According to one embodiment, the autofocus is a passive system, i.e., includes no illumination source, but rather uses a feedback loop optimizing the collection rate of the photoemission light.

BRIEF DESCRIPTION OF THE DRAWINGS

The invention is described herein with reference to particular embodiments thereof, which are exemplified in the drawings. It should be understood, however, that the various embodiments depicted in the drawings are only exemplary and may not limit the invention as defined in the appended claims.

FIGS. 1–1B are general schematics depicting the major components of the testing and debug system according to an embodiment of the invention.

FIG. 2A depicts an embodiment of the cooling plate in a top view, while

DETAILED DESCRIPTION

The present invention provides a testing system particularly suitable for rise time, timing; logic fault localization and other testing of microchips, especially from the backside through the substrate (e.g., flip chip packaged devices). Accordingly, the description proceeds with examples using flip chip. However, it should be appreciated that the invention is not limited to testing flip chips. For example, it is possible to take top-side packaged devices and "flip" them in a chip-scale package (CSP), or design the proper opening to ensure the emitted light gets through the top-side. What is desired is to be able to collect emission from a device of interest in the chip.

Figure 1A:
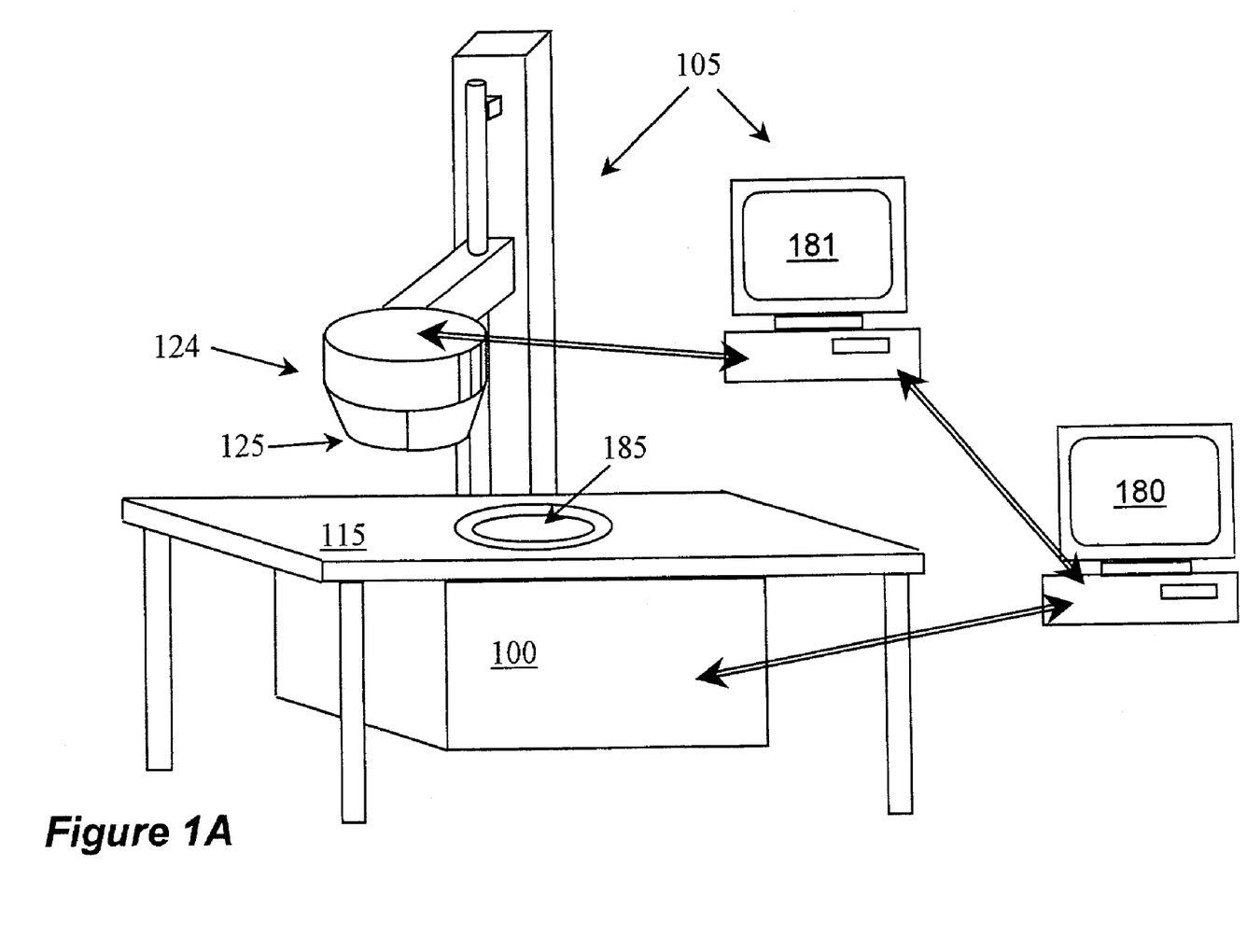
Figure 1B:
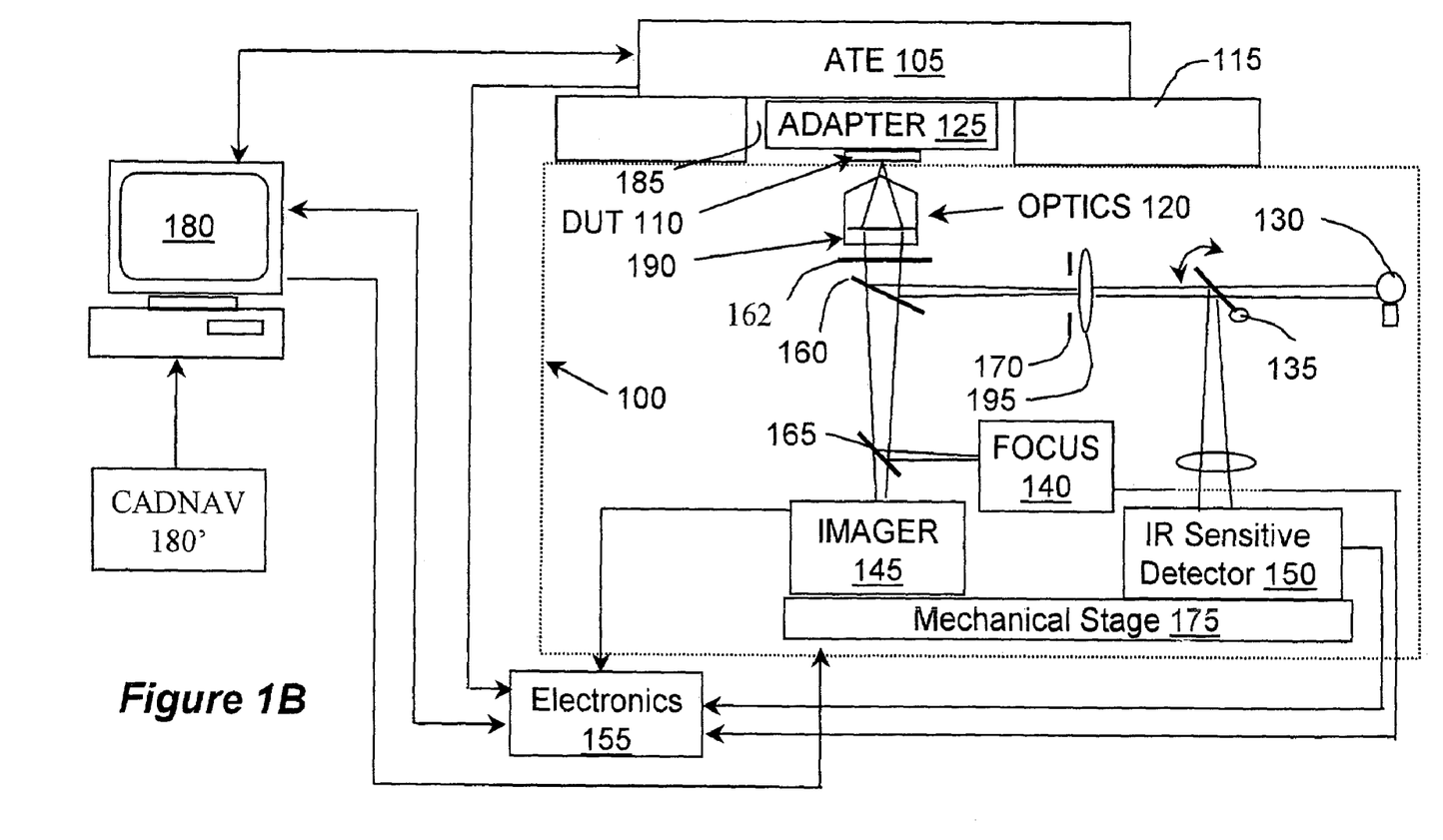

FIGS. 1A and 1B are general schematics depicting the major components of the testing and debug system according to an exemplary embodiment of the invention. The system operates in conjunction with a commercially available automated testing equipment 105 (ATE). The ATE generally comprises a controller, such as a pre-programmed computer 181, and a test head 124, which comprises an adapter 125 used to deliver signals generated by the controller 181 to the DUT 110 (FIG. 1B) in a manner well known in the art. Specifically, the ATE is used to generate signals that stimulate the DUT to perform various tasks, as designed by the chip designer to check and/or debug the chip. The various signals generated by the controller 181 are delivered to the DUT via the adapter 125. The adapter 125 may include a space transformer, a DUT load board and a DUT socket, in a manner well known in the art.

In the embodiment depicted in FIGS. 1A and 1B, the ATE test head is placed on top of a vibration isolated test bench 115, while the chamber 100 that houses the entire optics, imaging and sensing system, and an X-Y-Z stage 175, is situated below. This provides a tremendous advantage as it allows the system to be used with any type and size of ATE without interference with, or making modification to any of the elements inside chamber 100. Rather, the ATE is used to place the DUT from above, so that it is visible to the optics 120 via opening 185. Stage 175 enables placing of the collecting optics at any locations within the opening 185. While and X-Y-Z stage is used in this example, it should be apparent that other stages can be used to enable placement of the optics at an indicated location within opening 185.

The various elements of the system of FIGS. 1A and 1B will be described with reference to their operational modes. Generally, the system operates in two modes: navigation mode and detection mode. In the description, references to "navigation mode" should be understood to include navigation, target acquisition, and imaging. Therefore, these terms may be used interchangeably herein. In the navigation mode, an illumination source 130 is used to illuminate the DUT. Illumination source 130 emits light in the infrared (IR) range using, for example, an IR laser, or photodiode, or a tungsten-halogen lamp. The light is focused through the microscope objective onto and then reflects from the DUT and beam splitter 160. The imager 145 can be any two-dimensional detector capable of imaging in the infrared range, such as, for example, an intensifier vidicon, or InGaAs array. IR vidicons are commercially available from, for example, Hamamatsu (http://usa.hamamatsu.com). In this example the device of interest is fabricated on silicon. As is well known, wavelengths shorter than IR are absorbed in silicon. Therefore, in this example the illumination and imaging is done in IR. Of course, if the device of interest is fabricated on a different substrate, such as an SOI or GaAs, a different wavelength illumination and imaging may be used.

Beam splitter mirror 165 is used to deflect part of the collected light to the focusing system 140. Optionally, the overall imaging system may be connected to a Z-actuator 190 for auto-focusing purposes. However, an exemplary system for the auto-focus is described more fully below.

The switchable mirror 135 needs to be capable of selectively varying the optical path between the navigation and detection modes. For that purpose, mirror 135 may be mechanically moved or rotated, or it may be made of an active element capable of variable reflectivity according to the selected mode so that, for example, in one mode it is totally reflective, while in the other mode it is totally transmissive. For a rotational implementation, a substrate may be made having half of it transmissive and the other half reflective. Such a substrate can be provided with a rotating mechanism to insert in the optical path the reflective of transmissive part as desired.

Additionally, a mechanized aperture 170 is provided at the image plane of the collection optics 120, together with field lens 195. Notably, in this embodiment the entrance pupil of collection optics 120 is imaged by the field lens 195 onto the entranced plane of the focusing element of the detector in imager 145. In one implementation (not depicted here) the pupil entrance of the collection optics is imaged by the focusing element onto a fiber which couples the collected photons into the detector in imager 145. A feature of the present invention is that the illumination path takes place through the mechanized aperture 170 (which is positioned at the image plane of the collection optics) and thereby its opening defines the filed-of-view on the sample or device under test. The aperture also defines the portions of the sample imaged onto the imager 145. That is, depending on the particular test to be run, one may wish to select any particular section of the DUT for emission. Using information about the chip design and layout stored in CAD software, such as, for example, Cadence, and using navigation software, such as, for example, Merlin's Framework available from Knights Technology (www.electroglass.corn), one may select a particular device for emission test, and block the image and emission of the other devices in the field-of-view of the collection optics. When the user selects a device or location, the system activates the stage 175 so that the collection optics is centered on the selected device or location. Alternatively, as long as the area of interest is in the field-of-view of the collection optics, one can isolate the area of interest with the apertures and proceed to image and detect "selectively". Then, the aperture 170 may be adjusted to increase or decrease the field of view as appropriate for the particular test desired.

When an appropriate field of view has been set and an image obtained, mirror 135 is rotated so that the light path towards the IR sensitive detector 150 is established (opened). Additionally, light source 130 is shut off or blocked during testing. It should be appreciated, of course, that chamber 100 prevents any external light from reaching any of the optics, imagers and sensors enclosed within.

As will be described below, in other embodiments, where a fiber is used to couple light into the detector, a "probe area" is established by the area of the fiber core as it is imaged from the detector by the field lens and the collection optics onto the DUT. The diameter of this "probe area" is defined by the size of the fiber and the magnification defined by the focal lengths and distances of the optical train, the collection optics, field lens and the focusing optics at the fiber. In this configuration one can move the fiber with an X-Y actuator on the field of view defined by the collection optics. This additional feature gives the user the ability to move the probe area within the pre-selected area defined by the mechanized aperture.

Photon sensing during testing is done by detector 150, which is, for example, an infrared sensor, such as a photomultiplier tube (PMT), a photocathode coupled to a multichannel plate (MCP), an avalanche photodiode (APD), etc. The signal from the detector 150 is sampled by the high-speed data acquisition electronics 155. Electronics 155 is described in more details below. Controller 180, which may be a general-purpose computer running dedicated software, is used to control the various elements of the system, such as the actuators and stages and sampler. The controller 180 receives sync signals from the ATE 105.

A feature of the inventive system is that in testing mode focus is performed using the light emitted from the DUT. More specifically, the controller 180 performs photon counting of photon collected by the detector 150 at various Z positions. The Z position corresponding to the highest photon count is determined to be the focus position.

Figure 1C:
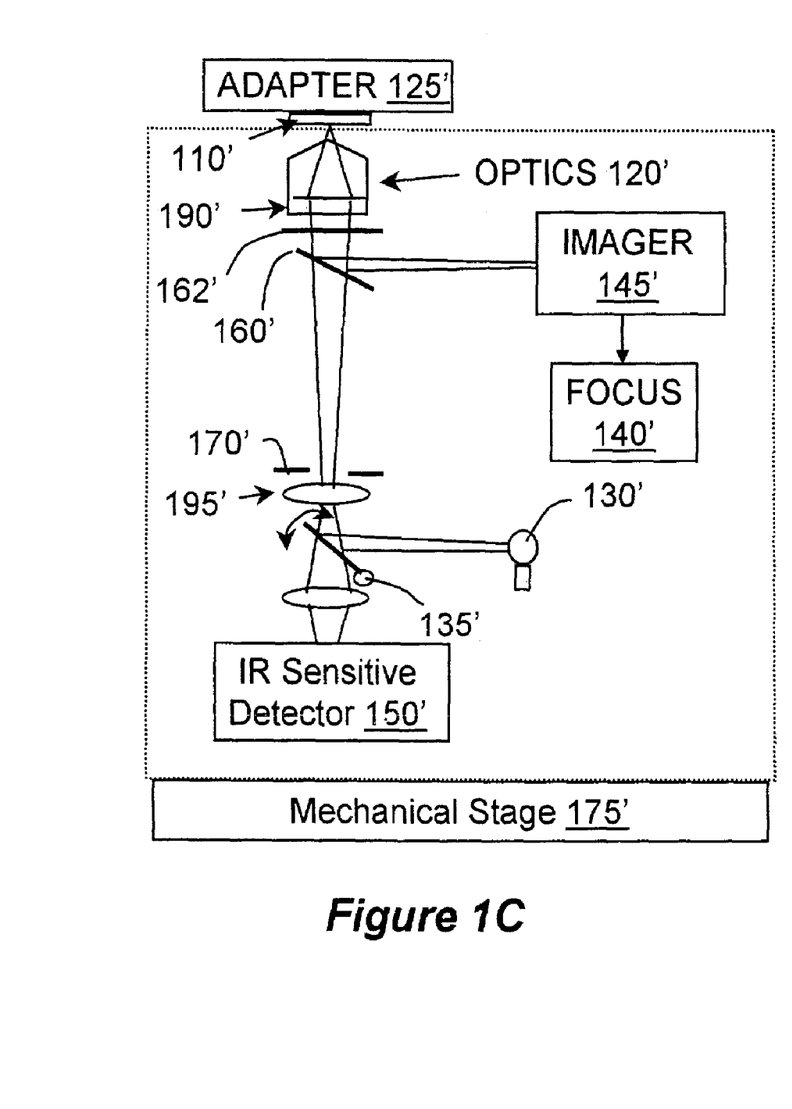
FIG. 1C depicts the major component of another embodiment of the inventive testing and debug system.

FIG. 1C depicts an embodiment of the present invention using the general construction of the embodiment of FIG. 1B, except using a different arrangement of the optics and detectors inside chamber 100. According to the embodiment of FIG. 1C, in the navigation mode switchable mirror 135' directs light from light source 130' towards the DUT 110'. Light reflected from the DUT passes through quarter-wave plate 162 and is deflected by polarizer mirror 160' towards the imager. Of course, as can be understood, quarter-wave plate 162' and polarizer mirror 106' can be replaced by a half mirror arrangement that is transparent to light from source 130', but reflects light coming from DUT 110'. As in the embodiment of FIG. 1B, mechanized aperture 170' with field lens 195' are provided at the image plane, and are illuminated from the back, so as to define the field of view. Also, in this embodiment the image obtained by the imager 145' is used by the focus algorithm 140'. This is an advantageous arrangement since in this manner all the light reflected from the DUT 110' is available to imager 145' for creating the image.

During the detection mode the mirror 135' is swung so that optical path to the IR sensitive detector 150' is created. Additionally, the light source 130' is preferably turned off. As can be understood, once the field of view was determined by the mechanized aperture during the navigation mode, it remains in the same position for the detection mode, thereby defining the field of view during the detection mode as well.

Various elements of the inventive system will now be further described in more detail, with reference to further embodiments of the invention. One particular feature of the embodiments of the present invention is the provision of integrated chip cooling. That is, in order to allow for full and accurate testing of the chip while simulating optimal operating environment, i.e., field conditions, the various embodiments of the invention provide for cooling and temperature control of the chip. As is well known, when chips are installed in computing equipment, various elements such as heat sinks and/or fans are provided in order to remove heat from the chip. Therefore, in the embodiments of the present invention various provisions are made in order to simulate such heat removal elements and allow for full and accurate testing. Moreover, the system enables active control of the temperature of the DUT in order to test the performance of the DUT with respect to various operating temperatures.

Figure 2A:
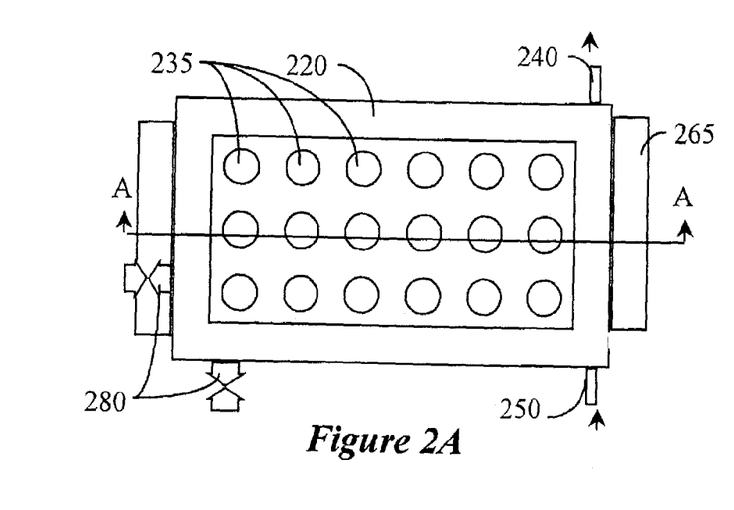
Figure 2B:
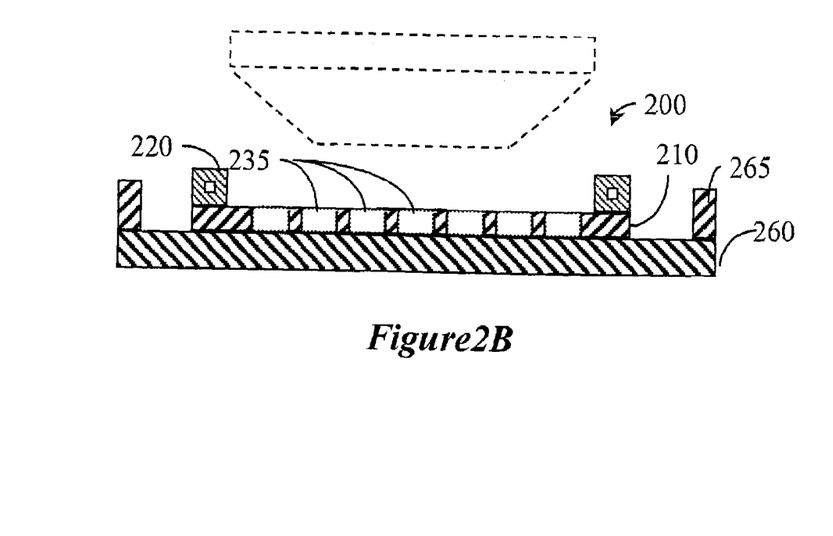
FIG. 2B is a cross section along lines A—A in FIG. 2A.

FIG. 2A depicts a first embodiment of heat removal system in the form of a cooling plate 210 in a top view, while FIG. 2B is a cross section along lines A—A in FIG. 2A. In FIG. 2B, DUT 260 is shown to include peripheral devices 265 for illustration purposes only. It would be appreciated that the system can also be used for inspection of DUT having no peripheral devices. The cooling plate 210 is preferably made of synthetic diamond using known methods, such as CVD. Fluid conduits 220 are provided on the top surface of the cooling plate 220, and have inlet 250 and outlet 240 for cooling fluid circulation (the pump and other fluid circulation elements are not shown as they are fully known in the art).

Cooling plate 210 needs to have a window for imaging the target area on the DUT. While a single window is sufficient under most circumstances, as shown in FIG. 2B peripheral elements 265 may sometime restrict placement and movement of cooling plate 210 over the DUT. Therefore, in the depicted embodiment cooling plate 210 includes an array of windows 235. Thus, for each target area on the DUT the appropriate window is selected and the collection optics 120 (shown in FIG. 2B in dashed lines) is aligned over the selected window using the x-y stage 175. The cooling plate can be moved over the flip chip using the x-y actuators 280, so that the window is aligned with a target area of the chip to be inspected. In order to maximize photon collection during testing, in the preferred embodiment each window 235 of cooling plate 210 has an immersion lens placed therein. The immersion lens may be such as the ones disclosed in U.S. Pat. Nos. 5,004,307, 5,208,648 and 5,282,088, or any other suitable immersion lens. However, in the depicted embodiment a novel bi-convex lens is used. This lens is shown in detail in FIG. 3, which is an enlarged area of one of the windows 235 of FIG. 2B.

Figures 3, 5:
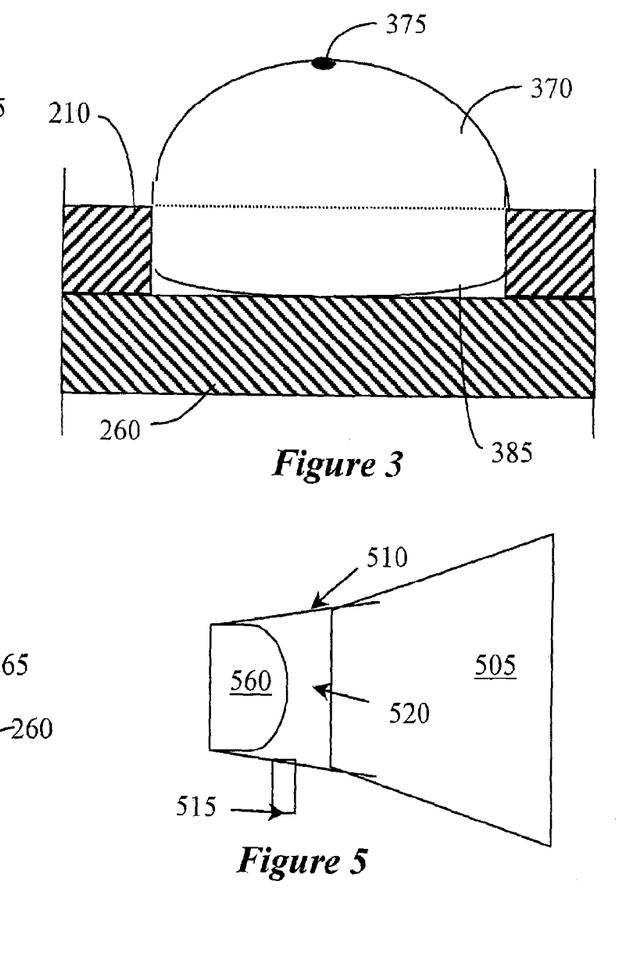
FIG. 3 depicts an embodiment of the inventive immersion lens.
FIG. 5 exemplifies an embodiment for a "pick and place" system for locating the immersion lens at the appropriate target location.

Notably, unlike prior art immersion lenses having a flat bottom surface, the immersion lens of FIG. 3 has a convex bottom surface 385. The convex bottom surface is advantageous in that it allows for easier lateral and vertical movement of the cooling plate, since it avoids vacuum condition with the DUT. Additionally, it allows for easier placement of the focus plane i.e., easier alignment of the optical axes, over the location of interest. Moreover, it provides voids, which may assist in collecting excess index matching fluid when it is used.

Another benefit of the bi-convex design is the ability to "press" with minimum force the immersion lens into the DUT to avoid having an air-gap between the immersion lens and the DUT. A conventional flat hemisphere cannot avoid the air-gaps and if pressed will require much more force and may break the DUT.

Another feature depicted in FIG. 3 is a center marking 375 provided on the center of the top surface of the immersion lens 370. Such a marking may be provided regardless of the type of immersion lens used. The marking is done to allow fast and accurate placement of the collection optics 120 over the immersion lens. That is, when the collection optics 120 is moved from one immersion lens to another, the marking facilitates fast acquisition and alignment of the objective of the collection optics with the target immersion lens.

Prior to testing, the collecting optics needs to be placed above a target area on the DUT. Controller 165 is used to move the cooling plate, so that one of the windows is placed generally to expose the target area and its neighborhood. The system is placed in a normal microscope mode, i.e., illumination source 130 is activated and the mirror 135 is inserted to provide a light path from the collection optics 120 to the imager 145 and focus 140. Imager 145 images the DUT through the appropriate window of the cooling plate and the collection optics. The illumination and imaging in the microscope mode can be done in bright-field mode, dark-field mode, or both. Bright filed and dark field illumination and imaging configurations are known in the art and, therefore, will not be detailed here.

Using the acquired image, the exact location of the target area is identified and the controller 165 activates the x-y stage to place the collection optics appropriately. Also, auto-focus 140 is used to control a Z-actuator so that the objective of collection optics 120 is focused on the target area of the DUT. Additionally, the area of interest within the field of view is defined using the aperture 170.

Figure 4:
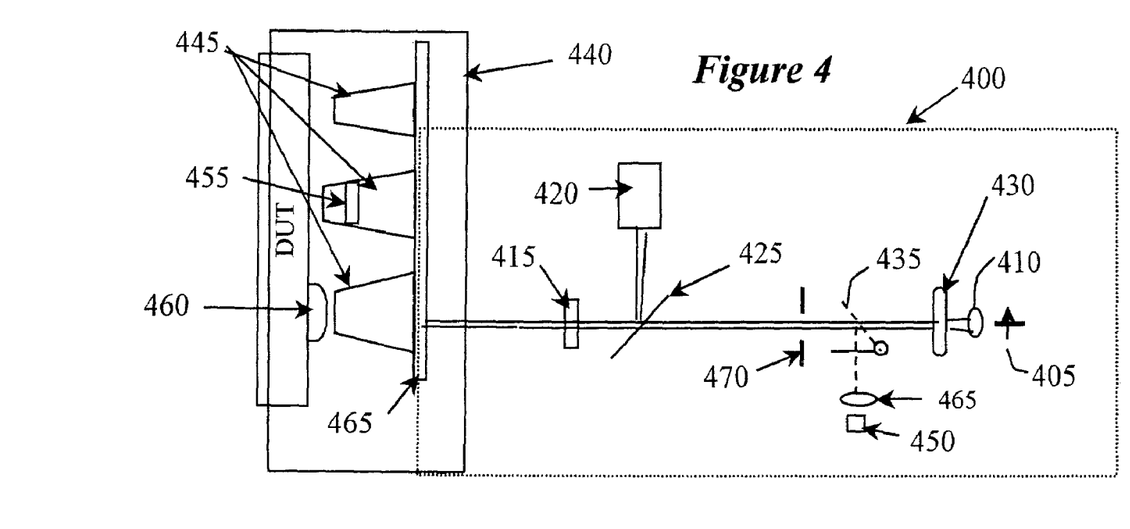
FIG. 4 depicts another embodiment of the inventive system, using laser scanning microscope for imaging.

FIG. 4 depicts another embodiment of the present invention. In FIG. 4, navigation and target acquisition is performed using a confocal laser-scanning microscope (LSM) 400. General information regarding confocal scanning microscopes can be found in: Generalizing the Confocal Microscope via Heterodyne Interferometry and Digital Filtering, P. C. D. Hobbs and G. S. Kino, Journal of Microscopy, Vol. 130, Pt. 3, 1990, pp. 245–264; and U.S. Pat. No. 5,532,873. You may want to refer to Kino book, and drop Hobbs).

LSM 400 is engaged when the infrared laser diode 405 is activated as a light source and mirror 435 is positioned to complete the optical path from the laser diode 405 to the DUT, as shown by the solid-line image. The light beam from laser 405 is scanned using scanner 430, which may be, for example, an acousto-optic deflector (AOD) or a rotating multi-facetted mirror. To disengage LSM 400 and allow detection of photoluminescence, laser diode 405 is deactivated and mirror 435 is positioned to complete the optical path from the DUT to the detector 450, as shown by the broken-line image.

In addition to laser diode 405, LSM 400 generally comprises lens system 410, which collects the light from the diode and directs it onto polarizer-mirror 425 and quarter-wave plate 415. The light then enters one of the objectives 445 selected by the objective turret 465. As exemplified in this embodiment, turret 465 carries three selectable objectives 445, each with different magnification; however, either a single or other multiple objective arrangements may be provided. Light reflected from the DUT is then collected and directed by the polarizer-mirror 425 towards the detector 420 (e.g., vidicon or InGaAs detector).

Two particular features are depicted in conjunction with the objectives 445. Aberration correction ring 455 is provided to compensate for varying thickness of the silicon. This is a particularly beneficial feature when observing through the backside of the chip. Also shown is the solid immersion lens 460. As with the previous embodiment, the solid immersion lens may be bi-convex. The solid immersion lens 460 can be used for final target imaging and for efficient emission collection. Additionally, in the exemplary embodiment, a "pick and place" system is provided to position and land the immersion lens 460 at the appropriate target location.

An embodiment of the pick and place system is exemplified in FIG. 5. Specifically, a microscope objective coupling housing 505 is provided with an adjustable sleeve 510 that enables an airtight coupling to the housing 505. The sleeve is placed over the immersion lens 560. Valve 515 is connected to an air pump so as to enable control of pressure in the chamber 520 defined by the immersion lens, the sleeve 510, and the objective housing 505. Reducing the pressure enables the operator to pick the lens 560 using vacuum forces. When the lens 560 is placed at the appropriate target location, the pressure can still be controlled to enable focusing. Additionally, the distance between the coupling objective and the immersion lens can be controlled in order to compensate for variations in the device thickness and aberration caused by the layers over the device. Also, the pump can be used to create an elevated pressure in the chamber 520 to ensure good surface contact between the lens and the chip surface and avoid air gaps. It has been discovered by the present inventors that when a pressure slightly elevated above atmospheric pressure is provided on a bi-convex immersion lens, the thinned sample wafer "warps" about the lens, thereby enabling increased collection of light from the wafer, and avoiding the gaps (air) that degrade the index matching between the SIL and the sample (caused by surface non-uniformities) which ensures high NA and good coupling.

Another feature exemplified in FIG. 4 in connection with the objective system is the provision of an active device cooling system 440. In this particular embodiment, a micro-spray cooling system is provided. The micro-spray cooling system is described in more details below with reference to FIG. 11.

For emission detection, laser 405 is switched off and mirror 435 is switched to the position shown in the broken-line image. In this position the light emitted and collected from the DUT is directed towards field lens 465 and the field of view is defined by mechanized aperture 470 placed in the image plane. Field lens 465 then projects the image onto the detector 450. The ATE provides the desired test vector to the DUT, while also providing synchronization signal to the system controller and detector electronics. Thus, when an emission (event) is detected, its relative "arrival" rime with respect to the synch signal is recorded to enable timing analysis of the performance of the DUT.

Figure 6:
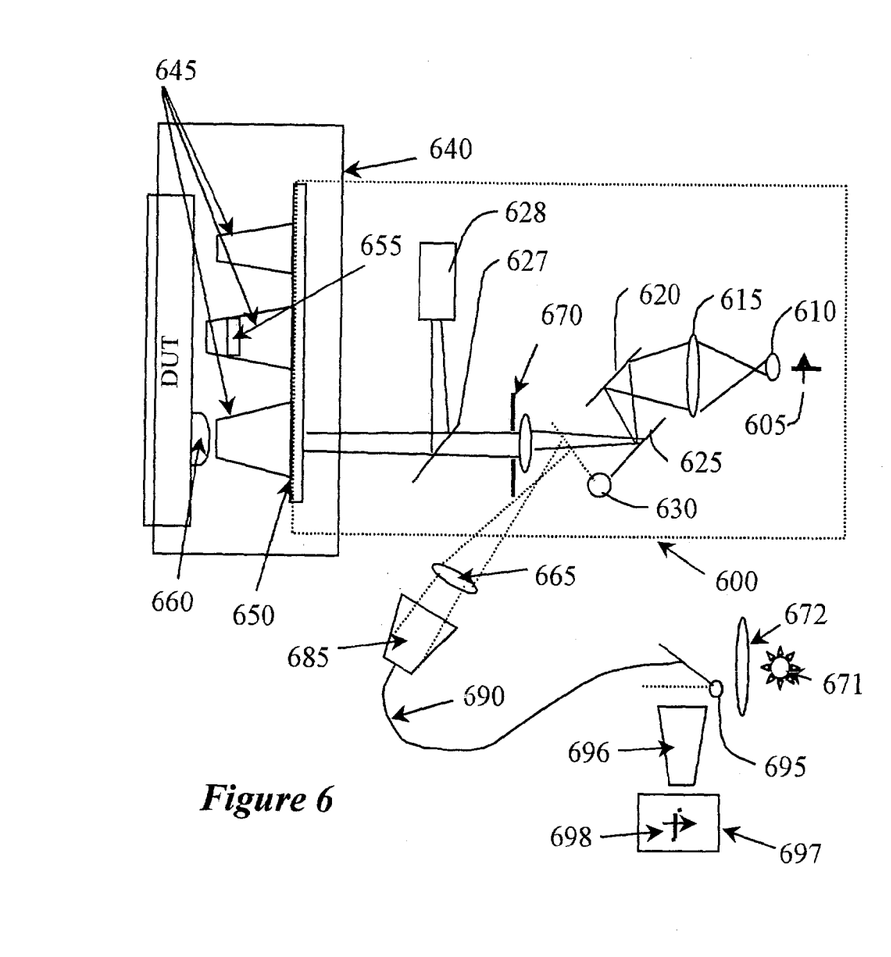
FIG. 6 depicts another embodiment of the present invention.

FIG. 6 depicts another embodiment of the present invention. Notably the embodiment of FIG. 6 includes two illumination sources. Specifically, two alternate illumination sources, 605 and 671, are provided for navigation, target acquisition, and imaging. In that mode, and using either illumination source, camera 628 is used for imaging via the dichroic (a mirror which with appropriate coating can reflect or transmit certain pre-assigned wavelengths, i.e. provided by CVI Laser) mirror 627. When using the light source 605, which is may be a tungsten halogen lamp or any other illumination source with near infra-red (1000 nm to 1700 nm wavelength) spectra, the system is set so that mirror 625, which is exemplified to be pivoted about axis 630, is in the position shown in solid line. On the other hand, when the light source 671 is used, or when the system is in emission detection mode, mirror 625 is set in the position shown in broken line.

When the light source 671 is used, or when the system is in emission detection mode, fiber optics 690 provides a light path between the collecting optics 685 and mechanized mirror 695. When navigating using light source 671, mirror 695 is positioned as shown by the broken line. In this position light from source 671 is collected by the illumination objective 672 and is transmitted via the fiber optics 690 to be used for illumination of the DUT. More particularly, the fiber is imaged through lens 665 and objective 645 onto the DUT. If desired, the image can be reduced using the mechanized aperture 670. The image on the DUT is then imaged back and is reflected by mirror 627 to be imaged by camera 628. An advantageous feature of the embodiments of FIG. 6 is that it enables better imaging within a selected field of view. This is done as follows. First, the system is set for imaging using light source 605 to illuminate the DUT through the back of mechanized aperture 670. Using device location from NavCad, the stage positions the objective over the location of the device. When the area of the device is imaged and an appropriate field of view is selected using the mechanized aperture 670, the system is switched for imaging using the light source 671. In this setup, the fiber can be moved within the selected field of view so as to image only a selected part of that field. Once the fiber is position exactly at the location of interest, the system is switched for emission detection. The aperture could also be shut down to a spacing in the probe (fiber) area.

During active device photoemission detection, mirror 695 is positioned as depicted in solid line, so as to reflect light collected towards collection objective 696. The emission reaching collection objective 696 is then detected by the detector 698, which is housed in a micro-cooler 697. The micro-cooler circulates cooling medium, such as helium or nitrogen, at flow rates enabling control of the detector's temperature to ensure optimum noise performance without reducing its efficiency. Low temperature assists in substantially reducing detector 698 noise.

Figure 7:
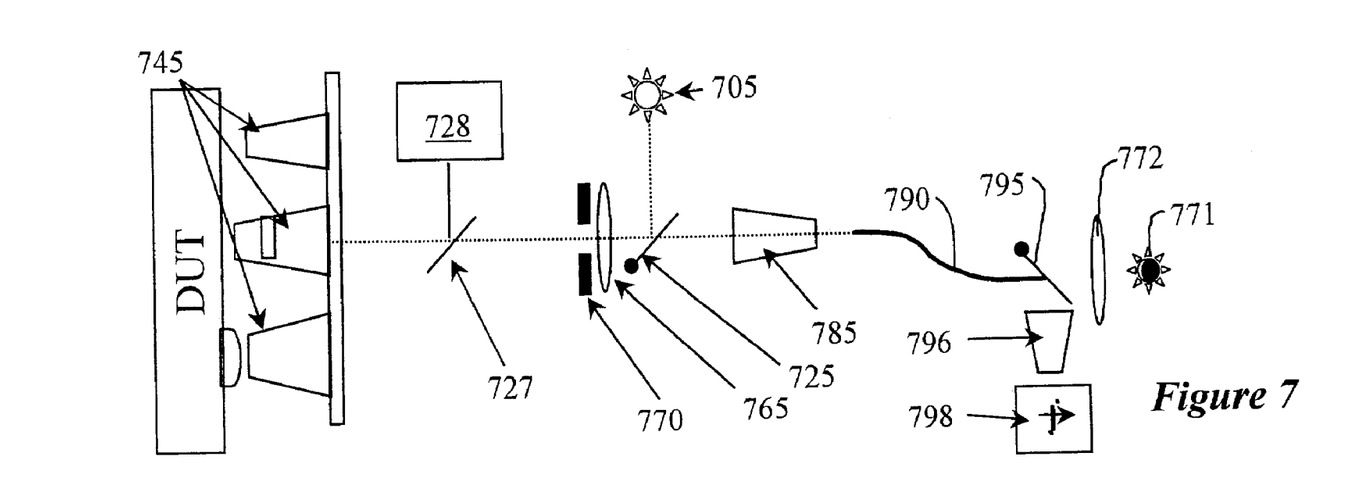
FIGS. 7–9 exemplify various setups of embodiments of the invention.
Figure 8:
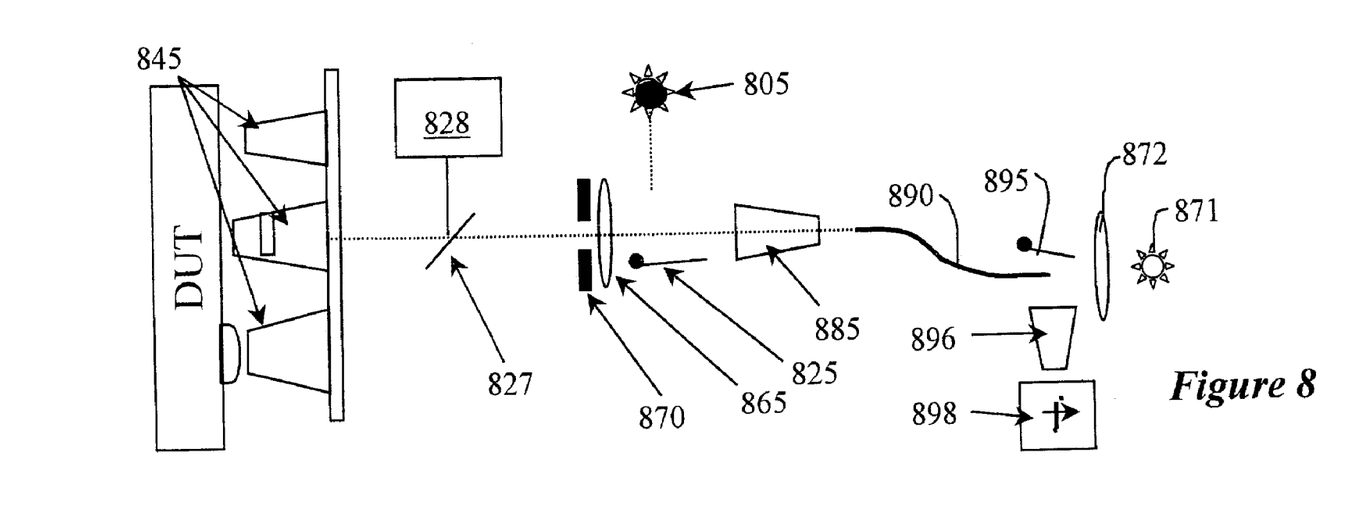
Figures 9, 12:
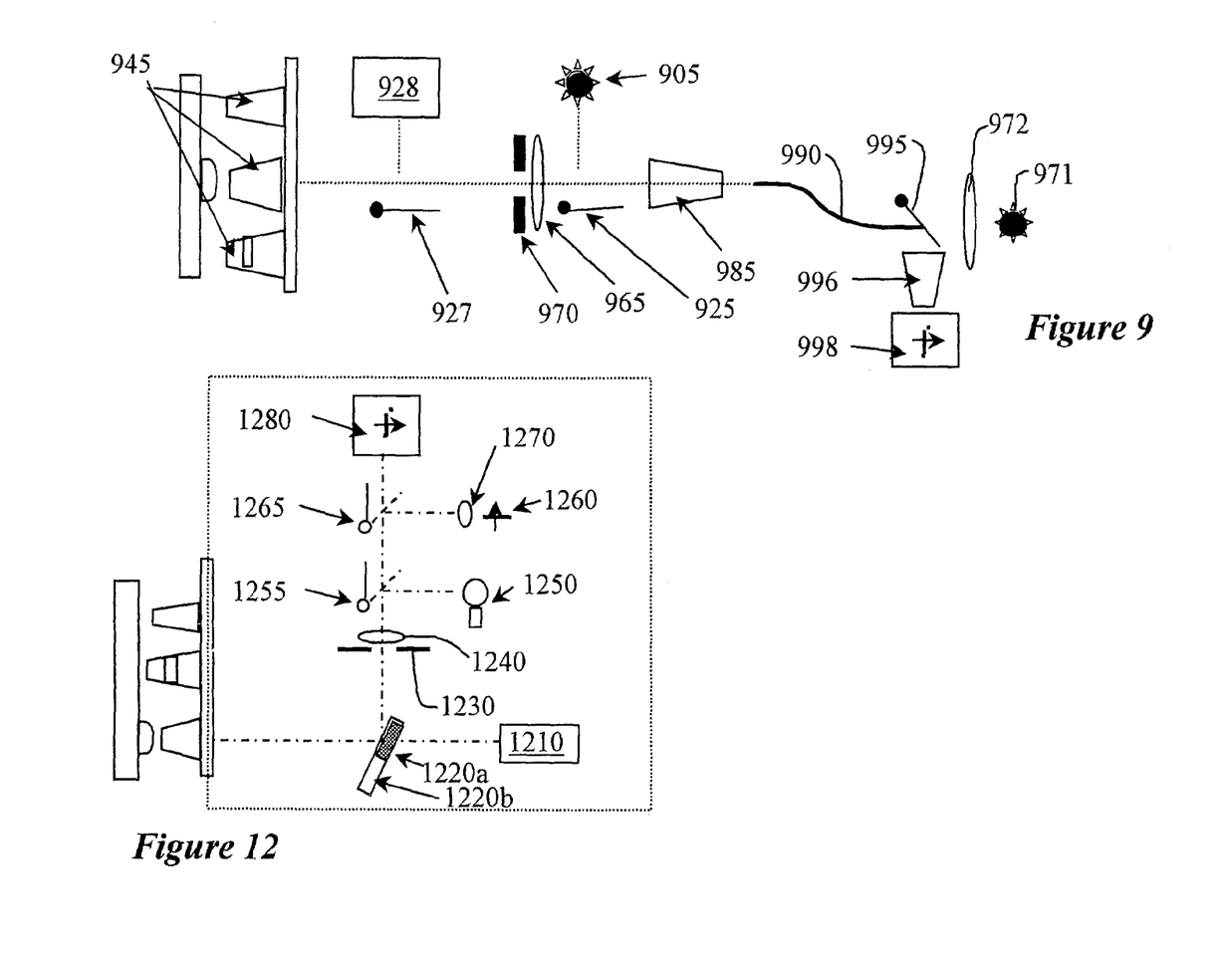
FIG. 12 depicts another embodiment of the present invention.

Another feature of the invention enabling reduction in noise is as follows. As noted with respect to the embodiment of FIG. 1, the system controller receives synchronization signal from the ATE. Therefore, for each device of interest, the system controller "knows" when an emission event can be expected. Accordingly, the system controller keeps the emission detector off until a predefined time when emission is expected. At that time, the emission detector is turned on for a predetermined period of time. When and if the detector detects a photon emission induced event, the arrival time of the event is recorded and stored. Specifically, according to one embodiment a timer is started at the start of the testing and is used to time the arrival of the photon relative to the synchronization signal from the ATE. According to another embodiment, the point in time in which the detector is turned on is recorded, and a timer is started at that time. Thus, the photon arrival time is observed with respect to the point in time when the detector was turned on. FIGS. 7–9 exemplify various operational modes of the embodiments of the invention. In FIG. 7, the system is set up for navigation using light source 705, which is depicted as being illuminated. Light source 771, on the other hand, is depicted as being turned off. Mechanized mirror 725 is placed in the path from light source 705 to objectives 745. Field lens 765 and mechanized aperture 770 are placed at the image plane and are illuminated from the backside. Accordingly, the size of the field of view can be selected using the aperture 770. The reflected light from the DUT is then sent to the camera 728 by dichroic mirror 727. Once the proper image has been acquired and the area of interest has been isolated in the field of view, the system is reconfigured to the setup depicted in FIG. 8.

As shown in FIG. 8, light source 805 is turned off, while light source 871 is turned on. Additionally, mechanized mirrors 825 and 895 are swung out of the light path. Since the aperture 870 selects the field of view, parts within the field of view can be imaged by properly moving the fiber optics within that field of view. In this manner, the fiber optics can be placed to image only a small area within the selected field of view. The image is recorded by the camera 828 with high spatial resolution. Then, the system is again reconfigured to the setup depicted in FIG. 9.

In FIG. 9, both light sources have been turned off. Additionally, mirror 995 is swung into the light path, so as to reflect incoming light towards the collection optics 996. In this particular embodiment, camera 928 is also taken out of the light path by swinging mirror 927 out. In this position, when the DUT is stimulated and a device emission occurs, the emitted light is collected by the immersion lens and objective, and is directed via the fiber optics 990 onto collection optics 996 and there from onto detector 998.

Figure 10:
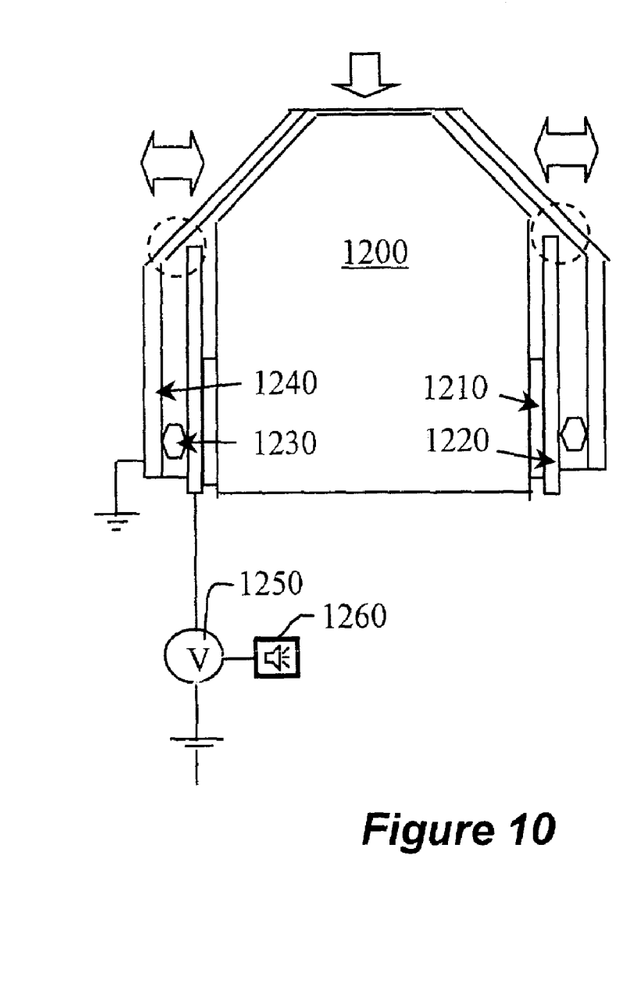
FIG. 10 depicts an embodiment of the inventive microscope objective/DUT crash protection system.

FIG. 10 exemplifies a microscope objective crash protection system that can be used in any of the objectives of any of the embodiments described above. As shown, objective 1200 is provided with an insulation ring 1210, upon which a conductive collar 1220 is affixed. The conductive collar is electrically biased, for example to 3 volts. A flexible insulating ring 1230 is provided about conductor ring 1220, and a conductive shield 1240 is affixed to the flexible ring 1230. Conductive shield 1240 is grounded and, therefore, shields the DUT from electrostatic discharge, ESD, caused by energized collar 1220. If the objective is moved towards the DUT or sideways towards a device on the DUT, as shown by the block arrows, the shield would compress against the energized collar, as exemplified by the broken circles. When that occurs, the conducting collar is also grounded and its potential drops to ground. This is detected by voltmeter 1250, which then activates an alarm 1260.

Figure 11:
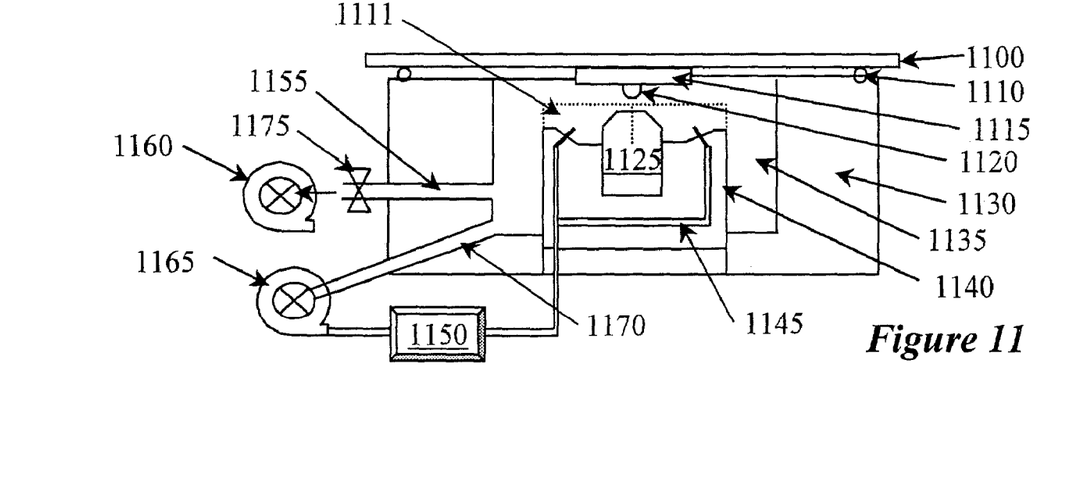
FIG. 11 depicts an embodiment of the inventive microspray cooling.

FIG. 11 exemplifies the micro-spray cooling according to an embodiment of the present invention. Specifically, DUT 1115 is affixed to a test adapter 1100 in a manner well known in the art. Chamber 1130 is pressed against the test adapter 1100 so as to form a seal using O-ring 1110. Objective 1125 is fitted with spray housing 1140 and is inserted into chamber 1130 in a sealed manner. Pump 1160 is then used to reduce the pressure inside void 1135. This is done in order to reduce the boiling point inside void 1135, i.e., the boiling point inside void 1135 can be variably controlled by changing the pressure inside the void 1135. It should be understood that the level of reduced pressure could be calculated according to the characteristics of the cooling fluid used and the boiling point desired.

Pump 1165 is then used to pump coolant through piping 1145 to be injected onto the DUT. It should be appreciated that this embodiment is particularly advantageous. First, since the cooling is done from below, excess fluid tends to drain from the DUT. Additionally, since a SIL 1120 is used, no fluid reaches the part of the DUT being imaged, so that the spray cooling causes no distortion of the image. Also, as opposed to traditional spray cooling where the jet is perpendicular, in the exemplary embodiment the spray cooling is at an angle in order to afford the imaging task.

As the cooling fluid is sprayed onto the DUT 1115, it evaporates in the void 1135. The vapor then condenses on the chamber 1130 walls, and is drained through channels 1170, back onto the pump 1165. The fluid may than be circulated in heat exchanger 1150 before being sprayed again onto the DUT. In this example, the spray pressure is variable controlled according to the temperature of the DUT, so that a desired temperature of the DUT is maintained. Alternatively, the spray can be pulsated and the duty cycle varied in order to maintain the appropriate cooling level.

To exchange objectives, the spraying is stopped and the remaining liquid is pumped out. The reduced pressure is then broken, using valve 1175 for example, and the objective is changed. It should be appreciated that since different objectives may have different size and shape, each objective may be fitted with its own housing 1140, or an adapter to a single housing 1140 may be used. Additionally, it should be appreciated that piping 1145 may simply terminate as spray outlet, or special spray heads may be affixed at the end of the piping 1145.

Using this system, the temperature of the DUT can be varied to test its operational characteristics under various temperature conditions. For example, the operator may input a certain operating temperature for testing the DUT. The actual temperature of the DUT is detected by either a device (i.e. thermocouple) placed in proper place and close proximity to the DUT or obtained through the appropriate device embedded in the DUT and read through the ATE in a manner known in the art. For example, a temperature diode may be embedded in the DUT, and its signal sent to the ATE. This is conventionally done for safety reasons, i.e., in order to shut the system if the DUT gets too hot. However, according to this embodiment of the invention, the temperature of the DUT is sent from the ATE to the controller 180. Using the actual DUT temperature, the controller 180 adjust the cooling rate (e.g., liquid pressure, flow-rate, cavity pressure, etc.) so as to operate the DUT at the temperature selected by the operator. To control the cooling rate, the controller 180 may adjust the rate of the cooling fluid spray, or change the pressure in the chamber so as to change the boiling point of the cooling liquid.

In order to obtain optimum cooling, it is beneficial to avoid spray from different spray head cross each other. This may be achieved in various ways. For example, the various spray heads can be synchronously pulsed so that their spray doesn't cross each other. Alternatively, a baffle or barrier (depicted by element 1111) can be provided to prevent cross spray.

FIG. 12 depicts yet another embodiment of the present invention. The embodiment of FIG. 12 includes a "laser pointer" feature, which allows pointing to a device of interest. During navigation, light source 1250 is activated, mirror 1255 is swung into the dashed-line position, and half mirror 1220a is placed into the position illustrated, so as to illuminate the DUT. Light reflected from the DUT is them passed through the half mirror 1220a and is imaged by the imager 1210. Once an image of an area of interest on the DUT is obtained, mirror 1265 is swung into the dashed-line position and mirror 1255 is swung into the solid-line position. Then, laser source 1260 is activated to create a laser beam through lens 1270 and illuminate the DUT. Laser light reflected from the DUT is imaged as a relatively small "laser pointer" image by the imager 1210. The stage can then be actuated until the "laser pointer" points to a device of interest. Once that is achieved, laser source 1260 is turned off, mirror 1265 is swung into the solid-line position, and solid mirror 1220b is swung into the light path previously occupied by half-mirror 1220a. In this position, the optical path to detector 1280 is aligned onto the same device previously illuminated by the "laser pointer" so that it can be emission tested.

Figure 13:
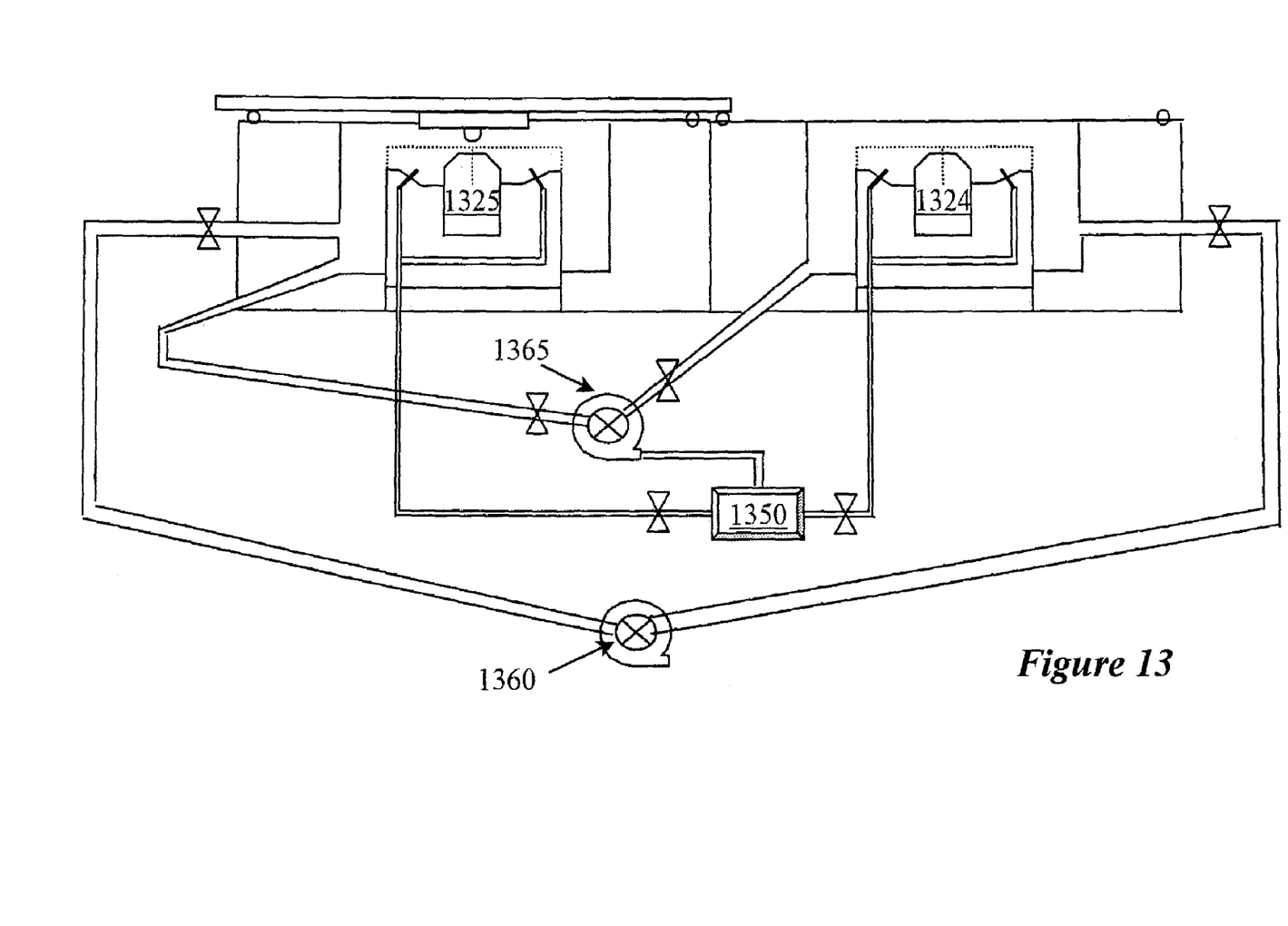
FIG. 13 depicts an embodiment of the inventive microspray cooling having dual-lens in registration.

FIG. 13 depicts another embodiment of the inventive micro-spray cooling having dual-lens arrangement in registration. For simplicity only two lenses, 1324 and 1325 are depicted, but more objectives may be used. As depicted, each objective has its own micro-spray chamber. Each chamber may have its own pumping and chilling equipment; however, as exemplified in FIG. 13, the tubing from each chamber may be connected to common pumping and chilling equipment using appropriate valves. The objectives within each chamber are in exact registration to each other, so that when a target device has been acquired using one objective, the controller using the registration can easily move the stage so as to position another objective over the acquired target device.

Figure 14:
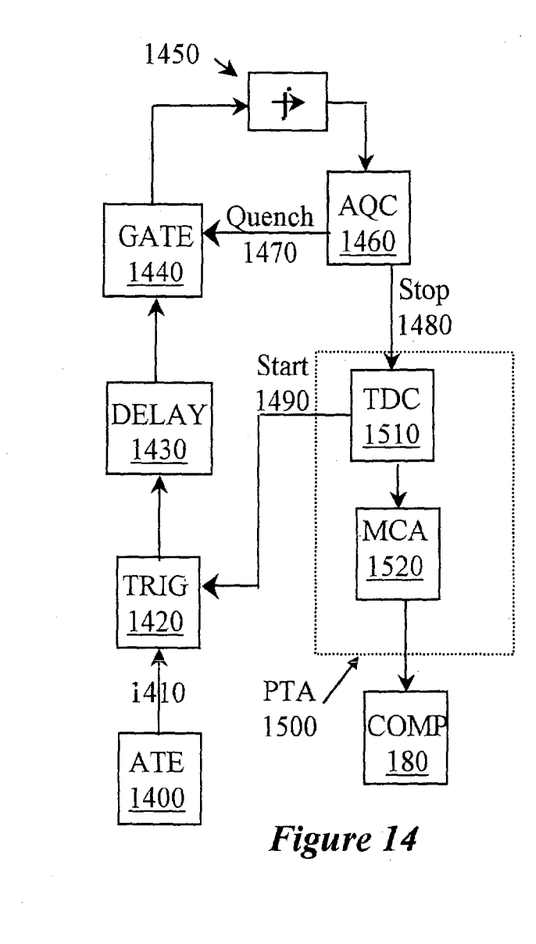
FIG. 14 exemplifies a high-speed time resolve emission detection scheme according to an embodiment of the present invention.

FIG. 14 exemplifies a high-speed time resolve emission detection scheme according to an embodiment of the present invention. Specifically, ATE 1400 generates a trigger signal 1410, which is sent to a triggering circuit 1420. Triggering circuit 1420 enables triggering on either the rising or falling edge of the trigger signal 1410, with a selectable amplitude, e.g., in the range of −2.5 to +2.5 Volts. When the appropriate triggering conditions have been detected, triggering circuit 1420 generates a high-speed "START" signal 1490, which defines the beginning of an acquisition sequence. The triggering circuit 1420 also provides a signal to a delay generation circuit 1430, which waits a user-selectable amount of time before issuing a signal to gating circuitry 1440. Gating circuitry 1440 is used to gate detector 1450 on and off. The gating circuitry 1440 gates on detector 1450, at which point it can detect individual photons. Detector 1450 remains gated on according to a user-selectable period of time as determined by the delay generation circuitry 1430, but detector 1450 can be actively quenched, i.e. gated off, if acquisition circuitry (ACQ) 1460 determines that a photon has been detected by detector 1450. Specifically, AQC 1460 monitors detector 1450 for photon detection, and if a photon is detected AQC 1460 sends two signal; the first signal, Quench 1470, instructs the gating circuitry to gate off detector 1450, while the second signal is a high-speed "STOP" signal 1480 which defines the photon arrival time at the detector. Thus, if a photon is detected by detector 1450, the Quench signal 1470 will instruct the gating circuitry 1440 to gate off detector 1440 before the delay circuitry 1430 would otherwise have caused gating circuitry 1440 to gate off the detector 1440.

The "START" 1490 and "STOP" 1480 signals are used by the Picosecond Timing Analyzer (PTA) 1500, which is a commercial test instrument. PTA 1500 comprises a time-todigital converter (TDC) 1510 and a multi-channel analyzer (MCA) 1520, which forms a histogram of the photon event times during a data acquisition sequence. The histogram is transferred to the computer 180 through the PTA electrical interface.

While the invention has been described with reference to particular embodiments thereof, it is not limited to those embodiments. Specifically, various variations and modifications may be implemented by those of ordinary skill in the art without departing from the invention's spirit and scope, as defined by the appended claims. Additionally, all of the above-cited prior art references are incorporated herein by reference.

What is claimed is:

1. An integrated system for testing an integrated circuit chip stimulated to simulate operating conditions, comprising:
    a test bench for placing the chip thereupon;
    collection optics comprising a solid immersion lens;
    a primary illumination source for illuminating said chip through said collection optics in a navigation mode;
    an imager for imaging said chip using light reflected from said chip and collected by the collection optics;
    a photon sensor operable in a detection mode to detect photons emitted from the chip and generate corresponding electrical signals;
    a gating timer for gating said photon sensor;
    a system controller receiving said electrical signals and providing timing information of said photons;
    wherein said primary illumination source ceases illuminating said chip during said detection mode.

2. The system of claim 1, further comprising a movable stage connected to said test bench from the underside, and wherein said collection optics is affixed to said movable stage.

3. The system of claim 1, further comprising a cooling mechanism enabling temperature control of said chip.

4. The system of claim 3, wherein said cooling mechanism comprises cooling fluid.

5. The system of claim 1, further comprising an optical element operable to selectively direct one of: light from the illumination source onto said chip, or photons emitted from the chip onto said photon sensor.

6. The system of claim 1, wherein said photon sensor comprises an avalanche photodiode.

7. The system of claim 1, further comprising a focus mechanism coupled to at least one of said imager and said photon sensor.

8. An integrated system for testing an integrated circuit chip, said chip coupled to an automated testing equipment (ATE) that sends stimulating signals to said chip to simulate operating conditions of said chip, said system comprising:
    a collection system for collecting photoemission from said chip and providing emission signals indicative of said photoemissions;
    a photon sensor;
    a gating timer for gating said photon sensor;
    a navigation system for orienting said collection system with respect to said chip;
    a cooling system for controlling temperature of said chip; and,
    a controller receiving sync signals from said ATE and receiving said emission signals to thereby time-resolve said emission signals.

9. The system of claim 8, wherein said collection system comprises a solid immersion lens.

10. The system of claim 9, wherein said immersion lens is a bi-convex solid immersion lens.

11. The system of claim 8, further comprising:
    an illumination source for selectively illuminating selected areas of said chip; and an optical imaging system for selectively imaging said selected areas of said chip.

12. The system of claim 11, further comprising a switching element enabling alternate collection of light by said photon sensor and said optical imaging system.

13. The system of claim 12, wherein said photon sensor comprises an avalanche photodiode.

14. The system of claim 8 wherein said cooling system comprises cooling fluid.

15. A method for testing a chip while simulating normal operating conditions of said chip, comprising:
    coupling said chip to an Automated Testing Equipment (ATE);
    illuminating and imaging selected areas of said chip through collection optics to identify an area of interest;
    ceasing illumination of said chip when an area of interest has been identified;
    providing said chip with test signals from said ATE;
    collecting photons emitted from said chip while it reacts to said test signals;
    controlling the temperature of said chip at least while collecting said photons.

16. The method of claim 15, further comprising obtaining a sync signal from said ATE to time-resolve collection of said photons.

17. The method of claim 15, wherein illuminating and imaging selected areas of said chip comprises controlling an aperture provided at an image plane of said collection optics.

18. The method of claim 15 wherein said controlling the temperature of said chip utilizes cooling fluid.

19. The method of claim 15, wherein said collecting photons emitted from said chip comprises pressing a solid immersion lens against said chip.

20. The method of claim 15, wherein said collecting photons emitted from said chip comprises gating a photon sensor according to signals obtained from said ATE.

* * * * *